(12) United States Patent
Hillard

(10) Patent No.: US 6,991,948 B2
(45) Date of Patent: Jan. 31, 2006

(54) METHOD OF ELECTRICAL CHARACTERIZATION OF A SILICON-ON-INSULATOR (SOI) WAFER

(75) Inventor: Robert J. Hillard, Avalon, PA (US)

(73) Assignee: Solid State Measurements, Inc., Pittsburgh, PA (US)

( * ) Notice: Subject to any disclaimer, the term of this patent is extended or adjusted under 35 U.S.C. 154(b) by 47 days.

(21) Appl. No.: 10/701,841

(22) Filed: Nov. 5, 2003

(65) Prior Publication Data

US 2005/0095728 A1  May 5, 2005

(51) Int. Cl.
*H01L 21/66* (2006.01)

(52) U.S. Cl. .......................... 438/17; 438/14; 438/455; 438/456; 438/457; 438/458; 324/765; 324/751; 257/48

(58) Field of Classification Search ............ 438/14–17, 438/455–458; 257/48; 324/751, 765
See application file for complete search history.

(56) References Cited

U.S. PATENT DOCUMENTS

| | | | |
|---|---|---|---|
| 5,032,786 A | 7/1991 | Kimura | |
| 5,164,805 A | 11/1992 | Lee | |
| 5,282,921 A | 2/1994 | Poultney | |
| 5,519,336 A | 5/1996 | Liu et al. | |
| 5,576,630 A | 11/1996 | Fujita | |
| 5,585,736 A | 12/1996 | Hshieh et al. | |
| 5,674,760 A | 10/1997 | Hong | |
| 5,786,231 A * | 7/1998 | Warren et al. ................. | 438/17 |
| 6,011,261 A | 1/2000 | Ikeda et al. | |
| 6,046,599 A | 4/2000 | Long et al. | |
| 6,160,415 A | 12/2000 | Jung | |
| 6,175,245 B1 * | 1/2001 | Bowe et al. ................. | 324/765 |
| 6,257,053 B1 | 7/2001 | Tomita et al. | |
| 6,275,059 B1 | 8/2001 | Sah et al. | |
| 6,326,220 B1 | 12/2001 | Chen et al. | |
| 6,410,353 B1 | 6/2002 | Tsai | |
| 6,621,281 B1 * | 9/2003 | Birdsley et al. ............ | 324/751 |
| 2002/0008530 A1 | 1/2002 | Kim et al. | |
| 2002/0115258 A1 | 8/2002 | Whang et al. | |
| 2002/0140039 A1 | 10/2002 | Adkisson et al. | |
| 2002/0167008 A1 | 11/2002 | Hopson et al. | |
| 2002/0180474 A1 | 12/2002 | Howland et al. | |
| 2003/0071317 A1 | 4/2003 | Ohyanagi et al. | |

FOREIGN PATENT DOCUMENTS

| | | |
|---|---|---|
| JP | 59033875 A | 2/1984 |
| JP | 59121978 A | 7/1984 |
| JP | 01211936 A | 8/1989 |
| JP | 03254133 A | 11/1991 |
| JP | 04162771 A | 6/1992 |
| JP | 05144895 A | 6/1993 |

(Continued)

*Primary Examiner*—Dung A. Le
(74) *Attorney, Agent, or Firm*—The Webb Law Firm

(57) ABSTRACT

A method of characterizing a silicon-on-insulator (SOI) wafer, comprised of an insulating layer sandwiched between a semiconductor top layer and a semiconductor substrate, includes moving a pair of spaced conductors into contact with a surface of the wafer exposed on a side thereof opposite the substrate. First and second biases are applied to the substrate and at least one of the conductors. At least one of the first and second biases are swept from a first value toward a second value and the current flowing through the SOI wafer in response to said sweep is measured. At least one characteristic of the wafer is determined from the measured current as a function of the one swept bias.

15 Claims, 6 Drawing Sheets

FOREIGN PATENT DOCUMENTS

| | | |
|---|---|---|
| JP | 07333232 A | 12/1995 |
| JP | 09101343 A | 4/1997 |
| JP | 09292365 A | 11/1997 |
| JP | 10178073 A | 6/1998 |
| JP | 10332632 A | 12/1998 |
| JP | 2002185011 A | 6/2002 |

* cited by examiner

METHOD OF ELECTRICAL CHARACTERIZATION OF A SILICON-ON-INSULATOR (SOI) WAFER

BACKGROUND OF THE INVENTION

1. Field of the Invention

The present invention relates to characterization of a silicon-on-insulator (SOI) wafer and, more particularly, to determining one or more functional parameters of the SOI wafer.

2. Description of Related Art

A growing number of semiconductor wafers in use today are silicon-on-insulator (SOI) wafers. Presently, semiconductor wafers have a relatively large diameter, e.g., 300 millimeters, and, prior to forming integrated circuits thereon, are relatively expensive to produce and/or acquire. Heretofore, characterization of a group of related semiconductor wafers, i.e., wafers formed from the same ingot, involved the physical formation of test structures on one or more test wafers selected from the group and the subsequent testing of the selected test wafer(s).

Once test structures are physically formed on a test wafer, the test wafer becomes unsuitable for use as a production wafer. Hence, once utilized, a test wafer is often discarded with the subsequent loss of revenue the wafer may have generated had it been utilized as a production wafer along with the cost associated with the production and/or acquisition of the wafer itself.

Because of the increasing use of SOI wafers, there is a growing and, heretofore, unfulfilled need for testing SOI product wafers in a non-destructive and non-contaminating manner.

SUMMARY OF THE INVENTION

The invention is a method of testing a silicon-on-insulator (SOI) wafer. The method includes providing an SOI wafer having an insulating layer sandwiched between a semiconductor top layer and a semiconductor substrate. A pair of spaced, elastically deformable contacts and a surface of the SOI wafer exposed on a side thereof opposite the semiconductor substrate are moved into contact. A first voltage is applied to the semiconductor substrate and a second voltage is applied to at least one of the probes. At least one of the first voltage and the second voltage is swept from a first value toward a second value. A current that flows in the SOI wafer in response to the sweep of the at least one voltage is measured and at least one characteristic of the SOI wafer is determined as a function of measured current flow and the at least one voltage.

The first voltage and/or the second voltage can be a DC voltage or a reference voltage, such as ground. The surface of the SOI wafer can be a dielectric overlaying a surface of the semiconductor top layer. The second voltage can be applied between the probes. At least a portion of each contact that contacts the semiconductor top layer can be formed from tantalum, platinum or iridium.

The step of determining at least one characteristic of the SOI wafer can include measuring a voltage of the semiconductor top layer itself and utilizing the measured voltage to determine the at least one characteristic of the SOI wafer.

The at least one characteristic of the SOI wafer includes at least one of: a threshold voltage; carrier mobility in the semiconductor top layer; conduction factor of the semiconductor top layer; trap density of an interface between the insulating layer and the semiconductor top layer; dopant density of the semiconductor top layer; and generation lifetime of the semiconductor top layer.

The invention is also a method of testing an SOI wafer comprised of an insulating layer sandwiched between a semiconductor top layer and a semiconductor substrate. The method includes causing a pair of spaced conductors to contact a surface of the SOI wafer exposed on a side thereof opposite the semiconductor substrate. A first bias is applied to the semiconductor substrate and a second bias is applied to at least one of the conductors. The first bias and/or the second bias is swept from a first value towards a second value. Current flowing in the SOI wafer during the sweep of the at least one bias is measured and at least one characteristic of the SOI wafer is determined from the measured current as a function of the at least one swept bias.

The pair of conductors can contact a dielectric disposed on a surface of the semiconductor top layer facing away from the semiconductor substrate. A voltage of the semiconductor top layer can be measured and utilized to determine the one characteristic of the SOI wafer.

The method can also include positioning a surface of the semiconductor substrate facing away from the insulating layer on a surface of an electrically conductive chuck and applying the first bias to the chuck whereupon the first bias is applied to the semiconductor substrate.

DETAILED DESCRIPTION OF THE INVENTION

The present invention will be described with reference to the accompanying figures where like reference numbers correspond to like elements.

Figure 1:
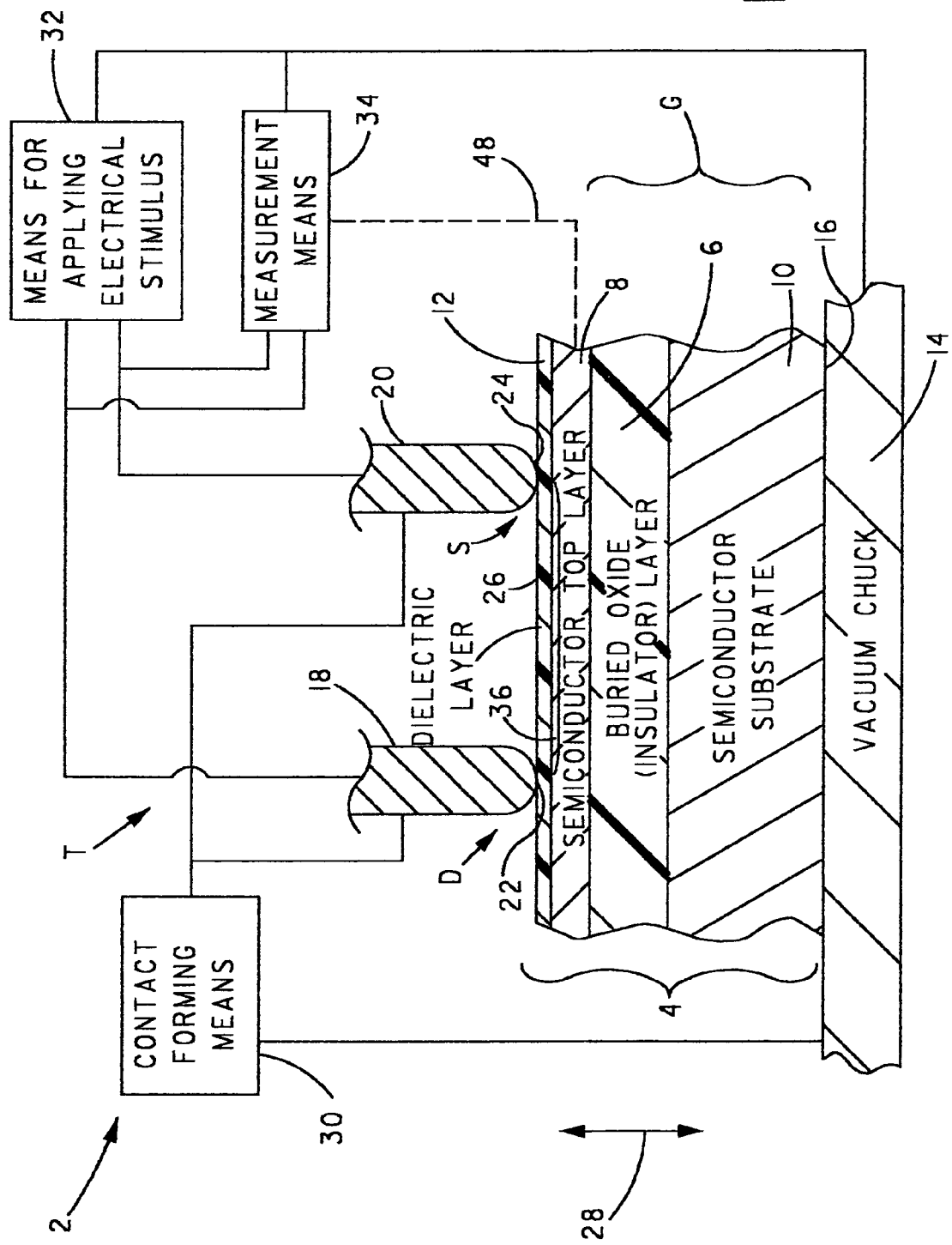
FIG. 1 is a combined block diagram and cross-sectional side view of an apparatus for measuring electrical characteristics of a silicon-on-insulator (SOI) wafer.

With reference to FIG. 1, an apparatus 2 is illustrated for measuring electrical characteristics of a silicon-on-insulator (SOI) wafer 4 having a buried oxide layer 6 sandwiched between a semiconductor top layer 8 and a semiconductor substrate 10. SOI wafer 4 typically also includes a dielectric 12 disposed on a surface of semiconductor top layer 8 opposite buried oxide layer 6.

Apparatus 2 includes an electrically conductive vacuum chuck 14 for holding a backside 16 of SOI wafer 4 by means of a vacuum (not shown). Apparatus 2 also includes a pair of contacts 18 and 20 defining conductive portions 22 and 24, respectively, configured to make contact with a topside 26 of SOI wafer 4. In FIG. 1, topside 26 is illustrated as being the exposed surface of dielectric 12. However, if dielectric 12 is extremely thin or not present, topside 26 can also or alternatively be the surface of semiconductor top layer 8 facing away from buried oxide layer 6.

Conductive portions 22 and 24 are desirably formed from an elastically deformable material, such as a smooth, highly polished metal, e.g., tantalum, platinum or iridium, a conductive elastomer or a conductive polymer. Desirably, contacts 18 and 20 have the form of an elongated probe wherein conductive portions 22 and 24, respectively, define the tips of the probes each having a hemispherical shape with a radius of curvature between 10 micrometers and 100 centimeters. However, the description of contacts 18 and/or 20 as having the form of a probe with a tip having a hemispherical shape is not to be construed as limiting the invention.

Apparatus 2 also includes a contact forming means 30, of the type well known in the art, for controlling the vertical movement of chuck 14 and/or contacts 18 and 20 in the directions shown by arrow 28 to move contacts 18 and 20 and SOI wafer 4 toward each other whereupon conductive portions 22 and 24 press into contact with topside 26.

Figure 2:
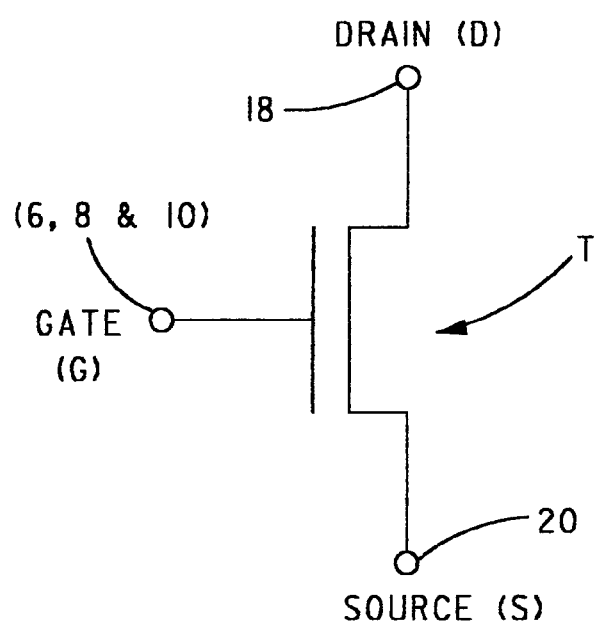
FIG. 2 is an equivalent circuit of a transistor T formed by the combination of the apparatus and SOI wafer shown in FIG. 1.

With reference to FIG. 2 and with continuing reference to FIG. 1, the combination of SOI wafer 4 having conductive portions 22 and 24 of contacts 18 and 20, respectively, in contact with topside 26 forms a metal oxide semiconductor transistor T, wherein contacts 18 and 20 define a drain D and a source S of transistor T and the combination of semiconductor top layer 8, buried oxide layer 6 and semiconductor substrate 10 define a gate G of transistor T.

A means for applying electrical stimulus 32 and a measurement means 34 are connected in parallel between chuck 14 and contacts 18 and 20. When semiconductor substrate 10 is received on chuck 14, chuck 14 acts as a contact for gate G of transistor T.

At a suitable time, the means for applying electrical stimulus 32 applies one or more suitable electrical stimulus to transistor T and measurement means 34 measures the response of transistor T to the electrical stimulus. More specifically, means for applying electrical stimulus 32 applies to chuck 14 and, hence, to gate G of transistor T a DC bias that induces the formation of a conductive channel 36 in semiconductor top layer 8 between, at least, contacts 18 and 20. When semiconductor top layer 8 is formed from N-type material, holes form conductive channel 36. When semiconductor top layer 8 is formed from P-type material, electrons form conductive channel 36. The applied DC bias can be adjusted as necessary to define the extent that conductive channel 36 is formed between contacts 18 and 20.

Typically, dielectric 12 is sufficiently thin (<30 Å) such that in response to the application of a voltage between drain D and source S (contacts 18 and 20, respectively), in the presence of the DC bias on gate G, a tunneling current flows between semiconductor top layer 8 and one or both of drain D and source S (contacts 18 and 20, respectively) of transistor T.

Utilizing apparatus 2, desirable characteristics of SOI wafer 4 can be determined. Examples of such desirable characteristics include threshold voltage ($V_T$); semiconductor top layer carrier mobility ($\mu$); semiconductor top layer conduction factor (k); semiconductor top layer buried oxide layer interface trap density ($D_{IT}$); semiconductor top layer dopant density ($N_{TOP}$); and semiconductor top layer generation lifetime.

Figure 3:
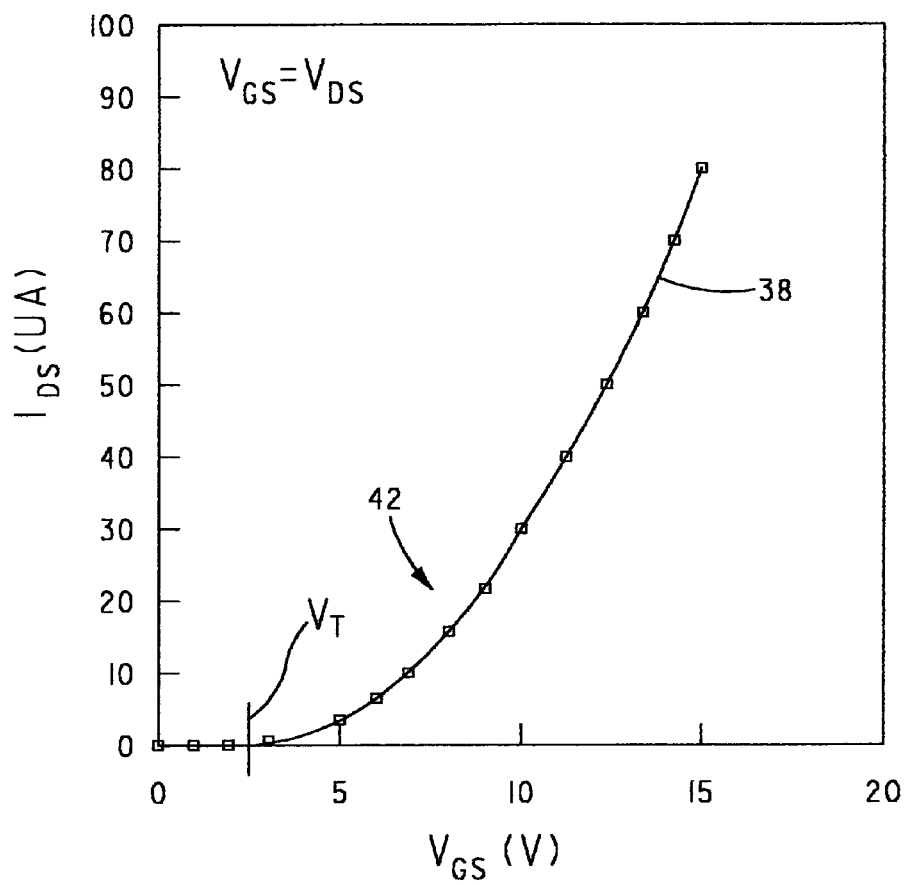
FIG. 3 is an exemplary curve of drain-to-source current ($I_{DS}$) versus gate-to-source voltage ($V_{GS}$) for transistor T in FIG. 2.

With reference to FIG. 3 and with continuing reference to FIGS. 1 and 2, to determine threshold voltage ($V_T$), means for applying electrical stimulus 32 applies a voltage $V_{DS}$ across the drain D and source S (contacts 18 and 20, respectively) and applies a voltage $V_{GS}$ across gate G and the source S (chuck 14 and contact 20, respectively). For the purpose of measuring threshold voltage $V_T$, $V_{DS}$ and $V_{GS}$ are derived from a common voltage source. Stated differently, for the purpose of measuring the threshold voltage $V_T$, one terminal of a DC voltage source is connected to the drain D and gate G (contact 18 and chuck 14, respectively) of transistor T and the other terminal is connected to source S (contact 20). This DC voltage is then swept from a first voltage, e.g., 0 volts, toward a second voltage, e.g., 15 volts. During this sweep, measurement means 34 measures the swept DC voltage and the current ($I_{DS}$) flowing between drain D and source S (contacts 18 and 20, respectively) in response to the swept DC voltage. An exemplary curve 38 of the drain-to-source current ($I_{DS}$) versus the swept DC voltage, in this example referred to as the gate-to-source voltage ($V_{GS}$), is shown in FIG. 3.

The DC or gate-to-source voltage ($V_{GS}$) where current commences flowing from drain D to source S is known as the threshold voltage ($V_T$). $V_T$ is shown in FIG. 3 as the point on the plot where current $I_{DS}$ commences flowing as a function of $V_{GS}$.

Figure 4:
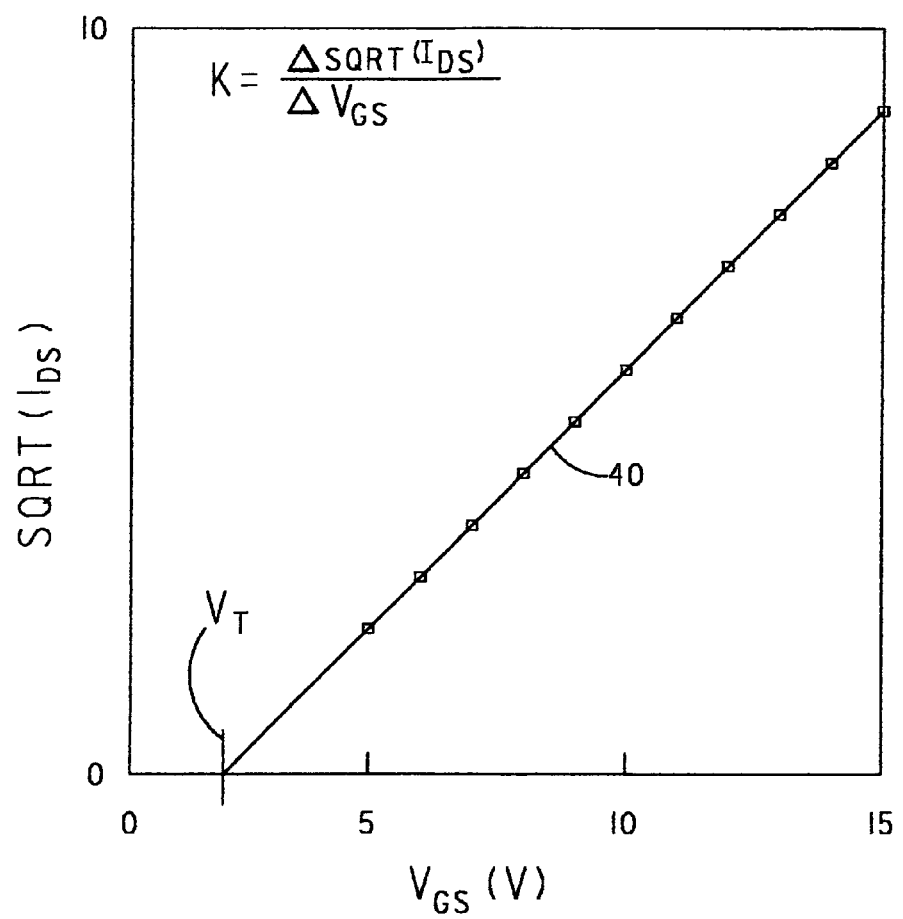
FIG. 4 is an exemplary curve of the square root of $I_{DS}$ versus $V_{GS}$ in FIG. 3 for transistor T in FIG. 2.

With reference to FIG. 4 and with continuing reference to FIGS. 1–3, a curve 40 utilized to determine the conduction factor (k) of semiconductor top layer 8 can be derived from curve 38 in FIG. 3. Specifically, the square root of $I_{DS}$ ($\overline{I_{DS}}$) versus voltage $V_{GS}$ at points in the knee 42 of curve 38 can be plotted to form curve 40. The conduction factor of semiconductor top layer 8 can then be determined from the slope of curve 40.

Figure 5:
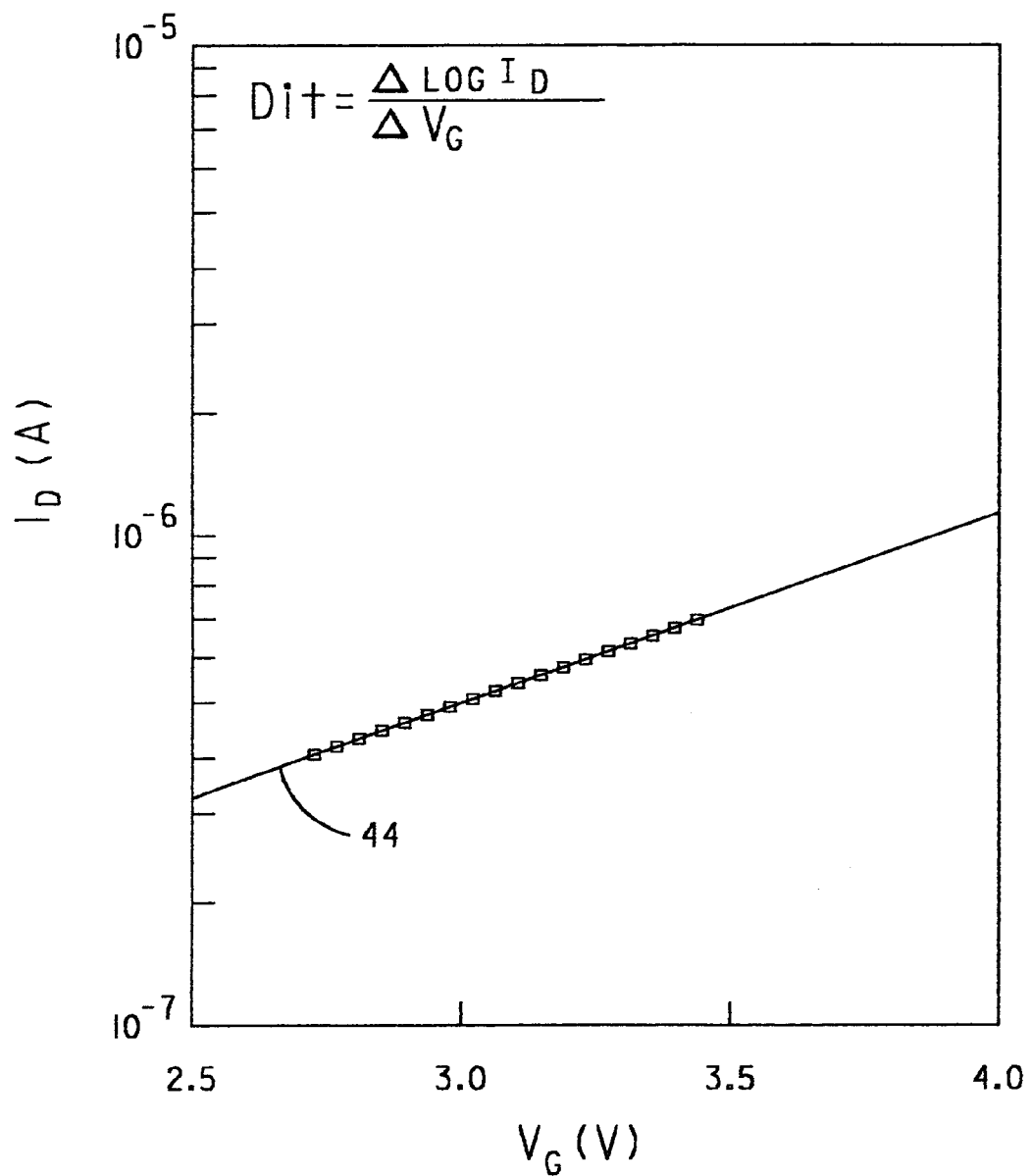
FIG. 5 is an exemplary curve of drain current ($I_D$) versus gate voltage ($V_G$) for transistor T in FIG. 2.

With reference to FIG. 5 and with continuing reference to FIGS. 1–4, to determine the interface trap density ($D_{IT}$) of semiconductor top layer 8, means for applying electrical stimulus 32 applies a reference voltage $V_R$ to drain D and/or source S (contacts 18 and 20, respectively), of transistor T and applies a gate voltage $V_G$ to gate G (chuck 14) of transistor T. Subject to maintaining the voltage applied between gate G and drain D and/or source S, i.e., $V_{GD}$ and/or $V_{GS}$, below the threshold voltage $V_T$ of SOI wafer 4, $V_G$ is swept from a first value toward a second value and reference voltage $V_R$ is changed to maintain transistor T below its threshold voltage $V_T$. During the sweep of $V_G$, measurement means 34 measures the total current flowing through the drain D and/or source S. Hereinafter, this total current is referred to as "$I_D$". Measurement means 34 then determines the base 10 logarithm ($\log_{10}$) of $I_D$ at various points along the sweep of $V_G$ and forms curve 44 of $\log_{10} I_D$ versus $V_G$. The trap density of the interface between semiconductor top layer 8 and buried oxide layer 6 is then simply the slope of curve 44.

Figure 6:
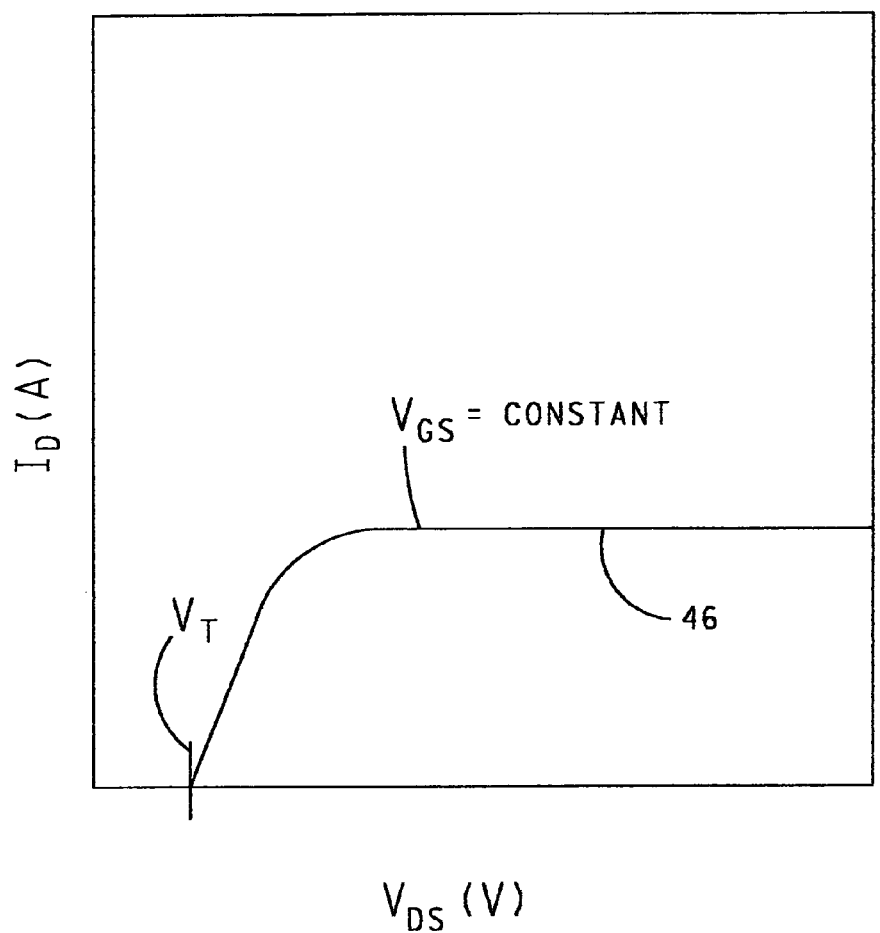
FIG. 6 is an exemplary curve of the total current flowing through the drain D in response to changing the drain-to-source voltage ($V_{DS}$) for a constant gate-to-source voltage ($V_{GS}$) for transistor T in FIG. 2.

With reference to FIG. 6 and with continuing reference to FIGS. 1–5, to determine the carrier mobility of semiconductor top layer 8, it is first necessary to determine the drain conductance $g_D$ and the capacitance $C_{OX}$ of buried oxide layer 6. Drain conductance $g_D$ can be determined at low drain voltage utilizing the following equation EQ 1:

$$g_D = \Delta I_D / [\Delta V_{DS}] \text{ for } V_{GS} = \text{constant voltage.} \qquad \text{EQ1}$$

In order to obtain $\Delta I_D$ and $\Delta V_{DS}$, means for applying electrical stimulus 32 applies a constant voltage $V_{GS}$ between gate G and source S (chuck 14 and contact 20, respectively) of transistor T. At the same time, means for applying electrical stimulus 32 applies a swept DC voltage $V_{DS}$ between drain D and source S (contact 18 and 20, respectively) of transistor T and measurement means 34 measures the current ID flowing through drain D in response to the swept $V_{DS}$. A curve 46 of $I_D$ versus $V_{DS}$ can then be formed and drain conductance $g_D$ can be determined from the slope of curve 46 at low drain-to-source voltages $V_{DS}$, i.e., at voltages adjacent threshold voltage $V_T$.

To determine $C_{OX}$, means for applying electrical stimulus 32 superimposes a small AC voltage $V_{AC}$ on a DC voltage ($V_{GS}$) that is applied between gate G and source S (chuck 14 and contact 20, respectively) of transistor T. Measurement means 34 measures an AC current $I_{AC}$ that flows between gate G and source S (chuck 14 and contact 20, respectively) in response to the application of the $V_{AC}$ on $V_{GS}$. Utilizing well known phasor analysis techniques, the capacitance $C_{OX}$ of gate G can be determined from the amplitudes of $I_{AC}$ and $V_{AC}$ and tie phase angle therebetween.

Once drain conductance $g_D$ and $C_{OX}$ have been determined, the values determined therefor can be utilized in the following equation EQ2 to determine the carrier mobility ($\mu$) of semiconductor top layer 8:

$$\mu \approx L g_D / [Z C_{OX} (V_{GS} - V_T)] \quad \text{EQ2}$$

where: L=length of channel 36;
Z=the width of channel 36;
$V_{GS}$=the gate G to source S voltage applied to determine $C_{OX}$; and
$V_T$=threshold voltage determined in the manner discussed above in connection with FIG. 3.

A dopant concentration, or dopant density, of semiconductor top layer 8 can be determined from a doping profile of semiconductor top layer 8 determined by plotting threshold voltage $V_T$ versus $(2\phi_F - V_{BS})^{1/2}$ and measuring a slope $m = \Delta V_T / \Delta (2\phi_F - V_{BS})^{1/2}$ where $\phi_F$ is equal to the Fermi level of semiconductor top layer 8 and $V_{BS}$ is equal to the voltage between semiconductor top layer 8 and source S (contact 20).

More specifically, in addition to measurement means 34 measuring changes in threshold voltage $V_T$ in the manner described above in connection with FIG. 3, measurement means 34 is connected to semiconductor top layer 8 via a line 48, shown in phantom in FIG. 1, whereupon measurement means 34 can measure the voltage $V_{BS}$ between semiconductor top layer 8 and source S (contact 20).

The doping concentration ($N_{TOP}$) of semiconductor top layer 8 can then be determined utilizing the following equation EQ3:

$$N_{TOP} = m^2 C_{OX}^2 / 2 q k_S \in_0 \quad \text{EQ2}$$

where: m=doping profile of semiconductor top layer 8 determined in the manner described above;
$C_{OX}$ is the capacitance of buried oxide layer 6 determined in the manner described above in connection with FIG. 6;
q=the charge of an electron;
$k_S$ is the conduction factor of silicon determined in the manner described above in connection with FIG. 4; and
$\in_0$ is the permittivity of air.

Lastly, to determine the generation lifetime of semiconductor top layer 8, SOI wafer 4 is allowed to assume a state of thermal and electrical equilibrium in the absence of any applied electrical stimulus. Next, means for applying electrical stimulus 32 applies an electrical pulse between gate G of transistor T (chuck 14) and drain D and/or source S (contacts 18 and/or 20, respectively) of transistor T. As a result of this pulse, electrical charge accumulates on the capacitor defined by semiconductor top layer 8, buried oxide layer 6 and semiconductor substrate 10 forming gate G. Measurement means 34 measures a time t for the charge accumulated on gate G to dissipate and for SOI wafer 4 to return to thermal and electrical equilibrium. This time t represents the generation lifetime of semiconductor top layer 8.

As can be seen, the use of a pair of spaced, elastically deformable contacts in contact with the exposed surface of SOI wafer 4 opposite semiconductor substrate 10 enables a variety of characteristics of SOI wafer 4 to be determined without the need to form physical test structures on SOI wafer 4. Since physical test structures do not need to be formed on SOI wafer 4, measurements can be made on production SOI wafers.

The invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method of testing a silicon-on-insulator (SOI) wafer comprising:
   (a) providing an SOI wafer having an insulating layer sandwiched between a semiconductor top layer and a semiconductor substrate;
   (b) moving a pair of spaced, elastically deformable contacts and a surface of the SOI wafer exposed on a side thereof opposite the semiconductor substrate into contact;
   (c) applying a first voltage to the semiconductor substrate;
   (d) applying a second voltage to at least one of the contacts;
   (e) sweeping at least one of the first voltage and the second voltage from a first value toward a second value;
   (f) measuring a current that flows in the SOI wafer in response to the sweep of the at least one voltage; and
   (g) determining at least one characteristic of the SOI wafer as a function of the measured current flow and the at least one voltage.

2. The method of claim 1, wherein at least one of the first voltage and the second voltage is a DC voltage.

3. The method of claim 1, wherein at least one of the first voltage and the second voltage is a reference voltage.

4. The method of claim 1, wherein the surface of the SOI wafer is a dielectric overlaying a surface of the semiconductor top layer.

5. The method of claim 1, wherein the second voltage is applied between the contacts.

6. The method of claim 1, wherein step (g) further includes:
   measuring a voltage of the semiconductor top layer; and
   utilizing the measured voltage to determine the at least one characteristic of the SOI wafer.

7. The method of claim 1, wherein the at least one characteristic includes at least one of:
   a threshold voltage;
   carrier mobility in the semiconductor top layer;
   conduction factor of the semiconductor top layer;
   trap density of an interface between the insulating layer and the semiconductor top layer;
   dopant density of the semiconductor top layer; and
   generation lifetime of the semiconductor top layer.

8. The method of claim 1, wherein at least a portion of each elastically deformable contact in contact with the semiconductor top layer is formed from one of tantalum, platinum and iridium.

9. A method of testing a silicon-on-insulator (SOI) wafer comprised of an insulating layer sandwiched between a semiconductor top layer and a semiconductor substrate, the method comprising:
(a) causing a pair of spaced conductors to contact a surface of the SOI wafer exposed on a side thereof opposite the semiconductor substrate;
(b) applying a first bias to the semiconductor substrate and a second bias to at least one of the conductors;
(c) sweeping one of the first bias and the second bias from a first value toward a second value;
(d) measuring current flowing in the SOI wafer during the sweep of the at least one bias; and
(e) determining at least one characteristic of the SOI wafer from the measured current as a function of the at least one swept bias.

10. The method of claim 9, wherein at least one of the first bias and the second bias is a DC voltage.

11. The method of claim 9, wherein at least one of the first bias and the second bias is a reference voltage.

12. The method of claim 9, wherein:
the SOI wafer includes a dielectric disposed on a surface of the semiconductor top layer facing opposite the semiconductor substrate; and
the pair of conductors contact the dielectric.

13. The method of claim 9, further including measuring a voltage of the semiconductor top layer and utilizing the measured voltage to determine the one characteristic of the SOI wafer.

14. The method of claim 9, wherein the at least one characteristic includes at least one of:
a threshold voltage;
carrier mobility in the semiconductor top layer;
conduction factor of the semiconductor top layer;
trap density of an interface between the insulating layer and the semiconductor top layer;
dopant density of the semiconductor top layer; and
generation lifetime of the semiconductor top layer.

15. The method of claim 9, further including:
positioning a surface of the semiconductor substrate facing opposite the insulating layer on a surface of an electrically conductive chuck; and
applying the first bias to the chuck whereupon the first bias is applied to the semiconductor substrate.

* * * * *